United States Patent
Yao

(10) Patent No.: US 10,082,714 B2
(45) Date of Patent: Sep. 25, 2018

(54) THIN-FILM TRANSISTOR SUBSTRATE MANUFACTURING METHOD, THIN-FILM TRANSISTOR SUBSTRATE, AND LIQUID CRYSTAL PANEL

(71) Applicant: Shenzhen China Star Optoelectronics Technology Co., Ltd., Shenzhen, Guangdong (CN)

(72) Inventor: Jiangbo Yao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 168 days.

(21) Appl. No.: 15/100,297

(22) PCT Filed: Mar. 31, 2016

(86) PCT No.: PCT/CN2016/078037
§ 371 (c)(1),
(2) Date: May 28, 2016

(87) PCT Pub. No.: WO2017/156799
PCT Pub. Date: Sep. 21, 2017

(65) Prior Publication Data
US 2018/0081214 A1   Mar. 22, 2018

(30) Foreign Application Priority Data
Mar. 31, 2016 (CN) .......................... 2016 1 0153360

(51) Int. Cl.
*H01L 29/66* (2006.01)
*G02F 1/1368* (2006.01)
(Continued)

(52) U.S. Cl.
CPC ...... *G02F 1/1368* (2013.01); *G02F 1/136227* (2013.01); *H01L 21/0262* (2013.01);
(Continued)

(58) Field of Classification Search
CPC ............. G02F 1/1368; G02F 1/136227; H01L 29/66969; H01L 29/42384; H01L 21/0273;
(Continued)

(56) References Cited

U.S. PATENT DOCUMENTS 9,859,439 B2 *  1/2018  Miyairi ............... H01L 29/7869
2002/0050599 A1   5/2002  Lee et al.
(Continued)

FOREIGN PATENT DOCUMENTS

CN            104617154 A      5/2015

*Primary Examiner* — Selim Ahmed
(74) *Attorney, Agent, or Firm* — Andrew C. Cheng

(57) ABSTRACT

A thin-film transistor substrate manufacturing method includes sequentially forming, on a backing, a gate electrode, a gate insulation layer, a source electrode and an active layer, a passivation layer, a drain electrode, and a pixel electrode. Orthogonal projections of the gate electrode, the gate insulation layer, the source electrode and the active layer, the passivation layer, the drain electrode, and the pixel electrode on the backing that are concentric centro-symmetric patterns. Also provided re a thin-film transistor substrate and a liquid crystal panel including the thin-film transistor substrate. The thin-film transistor substrate manufacturing method, the thin-film transistor substrate and the liquid crystal panel including the thin-film transistor substrate allow electrical property of a thin-film transistor consistent in all bending directions and make the thin-film transistor not easily subjected to stress damage during bending so as to improve the reliability of the thin-film transistor.

10 Claims, 4 Drawing Sheets

(51) Int. Cl.
| | |
|---|---|
| H01L 21/027 | (2006.01) |
| H01L 29/417 | (2006.01) |
| H01L 21/02 | (2006.01) |
| H01L 21/285 | (2006.01) |
| H01L 21/443 | (2006.01) |
| H01L 29/786 | (2006.01) |
| H01L 29/24 | (2006.01) |
| H01L 27/12 | (2006.01) |
| G02F 1/1362 | (2006.01) |
| H01L 29/423 | (2006.01) |
| G02F 1/1333 | (2006.01) |

(52) U.S. Cl.
CPC .... *H01L 21/0273* (2013.01); *H01L 21/02532* (2013.01); *H01L 21/02565* (2013.01); *H01L 21/02592* (2013.01); *H01L 21/02631* (2013.01); *H01L 21/2855* (2013.01); *H01L 21/443* (2013.01); *H01L 27/127* (2013.01); *H01L 27/1222* (2013.01); *H01L 27/1225* (2013.01); *H01L 29/24* (2013.01); *H01L 29/41733* (2013.01); *H01L 29/42384* (2013.01); *H01L 29/66765* (2013.01); *H01L 29/66969* (2013.01); *H01L 29/7869* (2013.01); *H01L 29/78669* (2013.01); *G02F 1/133305* (2013.01); *G02F 2202/10* (2013.01); *G02F 2202/103* (2013.01); *H01L 27/1218* (2013.01); *H01L 2029/42388* (2013.01)

(58) Field of Classification Search
CPC ............ H01L 29/41733; H01L 27/127; H01L 27/1225; H01L 27/1222; H01L 29/24; H01L 29/78669; H01L 29/7869; H01L 29/66765
See application file for complete search history.

(56) References Cited

U.S. PATENT DOCUMENTS

| | | |
|---|---|---|
| 2006/0102897 A1 | 5/2006 | Suh et al. |
| 2006/0262239 A1* | 11/2006 | Oana ................ H01L 29/41733 349/43 |
| 2013/0207101 A1* | 8/2013 | Yamazaki ......... H01L 29/41733 257/43 |

* cited by examiner

THIN-FILM TRANSISTOR SUBSTRATE MANUFACTURING METHOD, THIN-FILM TRANSISTOR SUBSTRATE, AND LIQUID CRYSTAL PANEL

CROSS REFERENCE TO RELATED APPLICATIONS

This application claims the priority of Chinese Patent Application No. 201610153360.4, "Thin-Film Transistor Substrate Manufacturing Method, Thin-Film Transistor Substrate, and Liquid Crystal Panel", filed on Mar. 17, 2016, the disclosure of which is incorporated herein by reference in its entirety.

BACKGROUND OF THE INVENTION

1. Field of the Invention

The present invention relates to the field of semiconductor manufacture technology, and more particularly to a thin-film transistor substrate manufacturing method, a thin-film transistor substrate, and a liquid crystal panel comprising the thin-film transistor substrate.

2. The Related Arts

Flexible screens have various advantages, including enhanced flexibility, more resistant to impacts, and lighter in weight, and are gaining more and more attention in the industry. When a thin-film transistor flexible screen is being bent, thin-film transistors included in the display screen undergo slight deformation and induce stresses. Heretofore, for different directions of bending a display screen, the thin-film transistors included in the display screen may induce different stresses and strains in different directions. This would lead to difference of electrical property of the thin-film transistor in different directions. In addition, the conventional thin-film transistor structure is often damaged by the stress during the bending of the thin-film transistor, thereby causing malfunctioning of the thin-film transistor.

SUMMARY OF THE INVENTION

In view of the above, the present invention provides a thin-film transistor substrate manufacturing method, a thin-film transistor substrate, and a liquid crystal panel comprising the thin-film transistor substrate, which overcomes the property deficiencies of the conventional thin-film transistor during bending.

A manufacturing method of a thin-film transistor substrate is provided, wherein the thin-film transistor substrate comprises a backing. The manufacturing method comprises: forming a gate electrode on a backing, wherein an orthogonal projection of the gate electrode on the backing is a first centro-symmetric pattern; forming a gate insulation layer on the gate electrode, wherein an orthogonal projection of the gate insulation layer on the backing is a centro-symmetric pattern that is concentric with respect to the first centro-symmetric pattern; forming an active layer and a source electrode on the gate insulation layer, wherein the source electrode surrounds an outer circumference of the active layer and an orthogonal projection of the source electrode on the backing and an orthogonal projection of the active layer on the backing are both centro-symmetric patterns that are concentric with respect to the first centro-symmetric pattern; forming a passivation layer on the source electrode and the active layer, wherein an orthogonal projection of the passivation layer on the backing is a centro-symmetric pattern that is concentric with respect to the first centro-symmetric pattern and the passivation layer comprises an area that corresponds to the active layer and comprises a via formed therein such that an axis of the via extends through a center of symmetry of the first centro-symmetric pattern; and forming a drain electrode within the via such that the drain electrode and the active layer are electrically connected; and forming a pixel electrode on the passivation layer and the insulation protection layer such that the pixel electrode has an end connected to the drain electrode In the above manufacturing method, "forming an active layer and a source electrode on the gate insulation layer" comprises: forming a semiconductor layer on the gate insulation layer, wherein an orthogonal projection of the semiconductor layer on the backing is a second centro-symmetric pattern and the second centro-symmetric pattern and the first centro-symmetric pattern are concentric; coating a first photoresist layer on an area of the gate insulation layer excluding the semiconductor layer and coating a second photoresist layer on the semiconductor layer, wherein an orthogonal projection of the second photoresist layer on the backing is a centro-symmetric pattern that is concentric with respect to the first centro-symmetric pattern and a portion of the semiconductor layer that is coated with the second photoresist layer forming the active layer; subjecting an area of the semiconductor layer excluding the portion coated with the second photoresist layer to ion injection so as to convert a portion of the semiconductor layer that excludes the active layer into a source electrode; and removing the first photoresist layer and the second photoresist layer.

In the above manufacturing method, the orthogonal projections of the gate electrode, the gate insulation layer, the source electrode, the active layer, and the drain electrode on the backing are circular or square.

In the above manufacturing method, "forming a semiconductor layer on the gate insulation layer" comprises: using chemical vapor deposition to deposit an amorphous silicon material on the gate insulation layer to form the semiconductor layer; or alternatively, using physical vapor deposition to deposit indium gallium zinc oxide on the gate insulation layer to form the semiconductor layer.

In the above manufacturing method, physical vapor deposition and a patterning operation are conducted to simultaneously form the drain electrode and the pixel electrode.

A thin-film transistor substrate comprises a backing. The thin-film transistor substrate further comprises: a gate electrode, a gate insulation layer, an active layer, a source electrode, a passivation layer, a drain electrode, and a pixel electrode; the gate electrode being arranged on the backing, an orthogonal projection of the gate electrode on the backing being a first centro-symmetric pattern; the gate insulation layer being on the gate electrode, an orthogonal projection of the gate insulation layer on the backing being a centro-symmetric pattern concentric with respect to the first centro-symmetric pattern; the active layer and the source electrode being both arranged on the gate insulation layer, the source electrode surrounding an outer circumference of the active layer, an orthogonal projection of the source electrode on the backing and an orthogonal projection of the active layer on the backing being both centro-symmetric patterns concentric with respect to the first centro-symmetric pattern; the passivation layer being located on the source electrode and the active layer, an orthogonal projection of the passivation layer on the backing being a centro-symmetric pattern concentric with respect to the first centro-symmetric pattern, the passivation layer having an area corresponding to the active layer and comprising a via formed therein, the via having an axis extending through a center of symmetry of the first centro-symmetric pattern; the drain electrode being located in the via and electrically connected to the active layer; the pixel electrode being located on the passivation layer and the insulation protection layer, the pixel electrode having an end connected to the drain electrode.

A liquid crystal panel comprises the above described thin-film transistor substrate.

Thus, the present invention provides a thin-film transistor substrate manufacturing method, a thin-film transistor substrate, and a liquid crystal panel comprising the thin-film transistor substrate, in which a thin-film transistor that is of centro-symmetry is formed on a backing such that the thin-film transistor receives similar stress and strain in all the bending directions and thus the electrical property of the thin-film transistor is all the bending direction are consistent. Further, compared to other non-symmetric structures, due to being hard to induce stress asymmetry in the thin-film transistor so that the thin-film transistor is not easily damaged by stress, the centro-symmetric structure improves the reliability of the thin-film transistor.

BRIEF DESCRIPTION OF THE DRAWINGS

To more clearly explain the technical solution proposed in the present invention, a brief description of the drawings that are necessary for embodiments is given as follows. It is obvious that the drawings that will be described below show only some embodiments of the present invention. For those having ordinary skills of the art, other drawings may also be readily available from these attached drawings without the expense of creative effort and endeavor.

DETAILED DESCRIPTION OF THE PREFERRED EMBODIMENTS

A clear and complete description will be given to a technical solution of an embodiment of the present invention with reference to the attached drawings of the embodiment of the present invention.

Figure 1:
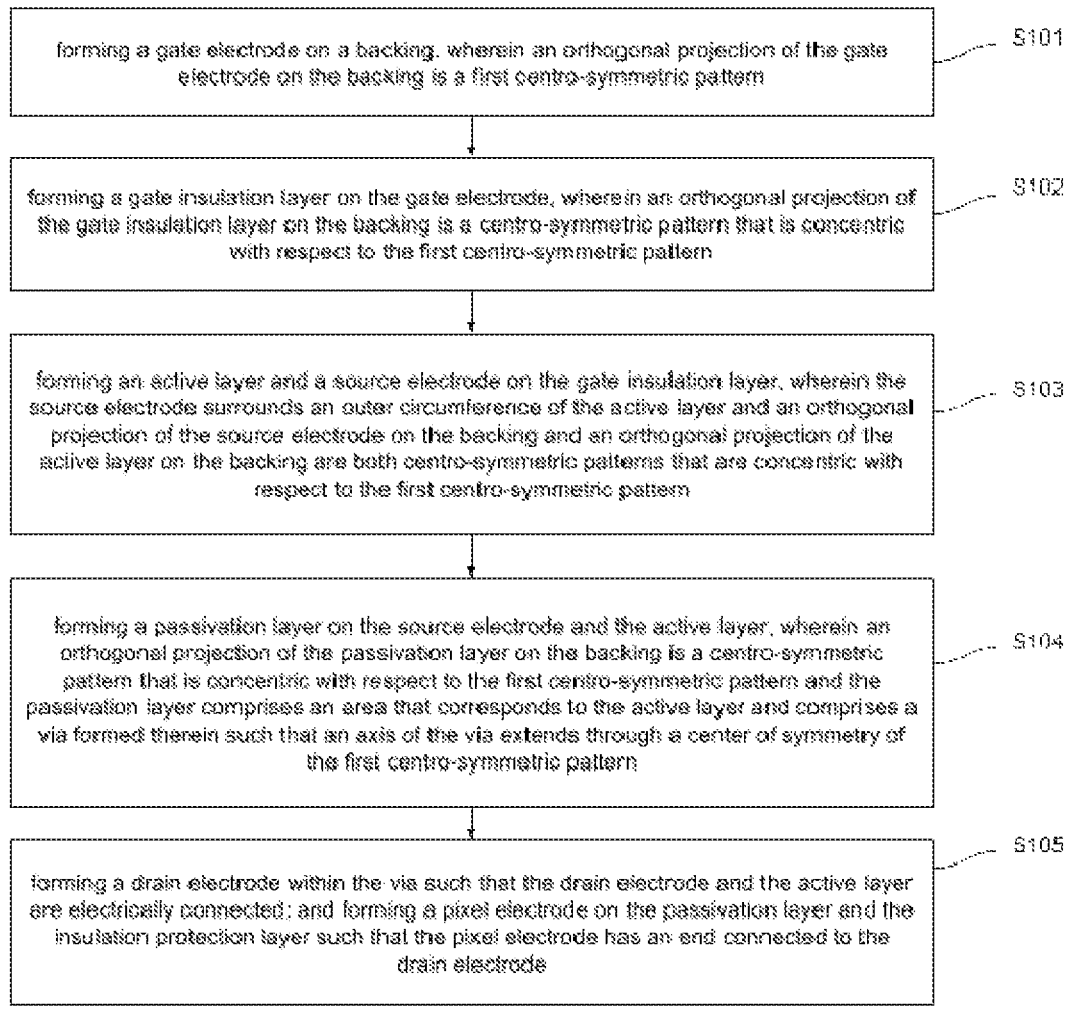
FIG. 1 is a flow chart illustrating a manufacturing method according to an embodiment of the present invention.

FIG. 1 is a flow chart illustrating a manufacturing method 100 of a thin-film transistor substrate according to an embodiment of the present invention. A thin-film transistor substrate is one of key components of a liquid crystal pane. The thin-film transistor substrate comprises a backing. The backing is generally a glass plate or a polyimide (PI) film. The backing is provided thereon with a thin-film transistor array, scan lines, data lines, and a driver chip. As shown in FIG. 1, the manufacturing method 100 comprises:

S101: forming a gate electrode on a backing, wherein an orthogonal projection of the gate electrode on the backing is a first centro-symmetric pattern;

S102: forming a gate insulation layer on the gate electrode, wherein an orthogonal projection of the gate insulation layer on the backing is a centro-symmetric pattern that is concentric with respect to the first centro-symmetric pattern;

S103: forming an active layer and a source electrode on the gate insulation layer, wherein the source electrode surrounds an outer circumference of the active layer and a orthogonal projection of the source electrode on the backing and an orthogonal projection of the active layer on the backing are both centro-symmetric patterns that are concentric with respect to the first centro-symmetric pattern;

S104: forming a passivation layer on the source electrode and the active layer, wherein an orthogonal projection of the passivation layer on the backing is a centro-symmetric pattern that is concentric with respect to the first centro-symmetric pattern and the passivation layer comprises an area that corresponds to the active layer and comprises a via formed therein such that an axis of the via extends through a center of symmetry of the first centro-symmetric pattern; and S105: forming a drain electrode within the via such that the drain electrode and the active layer are electrically connected; and forming a pixel electrode on the passivation layer and the insulation protection layer such that the pixel electrode has an end connected to the drain electrode.

Figure 2:
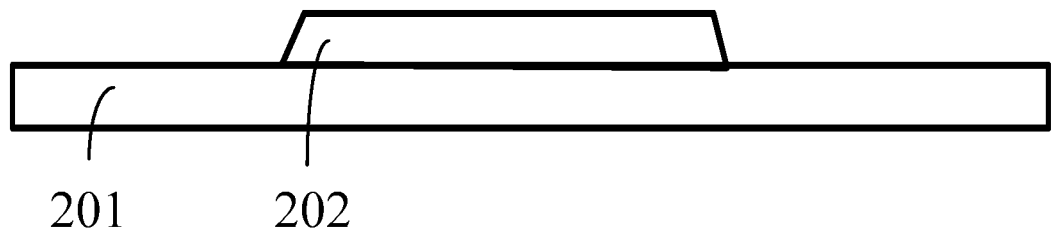
FIG. 2 is a schematic view illustrating forming a gate electrode in the manufacturing method according to the embodiment of the present invention.

Specifically, as shown in FIG. 2, in S101, physical vapor deposition is used to deposit a metal layer on the backing 201. The metal layer is formed of a material comprising, but not limited to, aluminum or molybdenum. Next, a patterning operation is applied to pattern the metal layer so as to eventually form the gate electrode 202. The orthogonal projection of the gate electrode 202 on the backing 201 is the first centro-symmetric pattern. In the instant embodiment, preferably, the first centro-symmetric pattern is circular. In another embodiment, other regular operations may be applied to form the gate electrode 202, and/or the orthogonal projection of the gate electrode 202 on the backing 201 can be other centro-symmetric patterns, such as a square.

Figure 3:
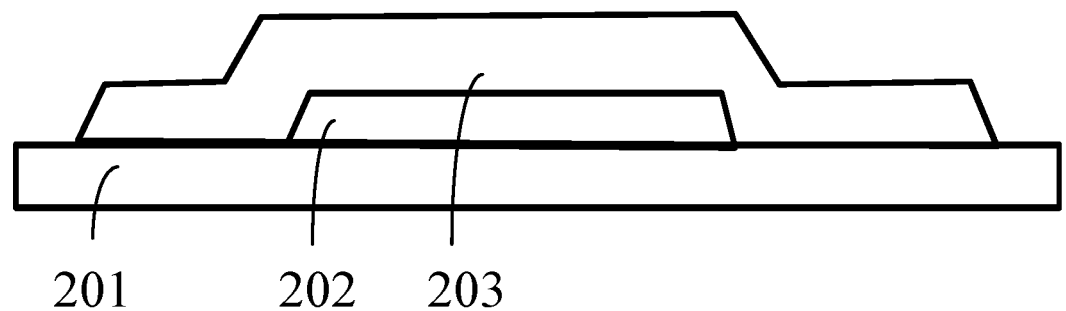
FIG. 3 is a schematic view illustrating forming a gate insulation layer in the manufacturing method according to the embodiment of the present invention.

As shown in FIG. 3, in S102, chemical vapor deposition is used to deposit the gate insulation layer 203 on the gate electrode 202. The gate insulation layer 203 is formed of a material comprising, but not limited to, silicon nitride or silicon oxide. The gate insulation layer 203 completely covers the gate electrode 202 to provide an effect of isolating the gate electrode 202 from other deposited layers. The orthogonal projection of the gate insulation layer 203 on the backing 201 is circular and is concentric with respect to the orthogonal projection of the gate electrode 202 on the backing 201. In another embodiment, other regular operations can be applied to form the gate insulation layer, and/or the orthogonal projection of the gate insulation layer 203 on the backing 201 can be other centro-symmetric patterns, such as a square.

Figure 4:
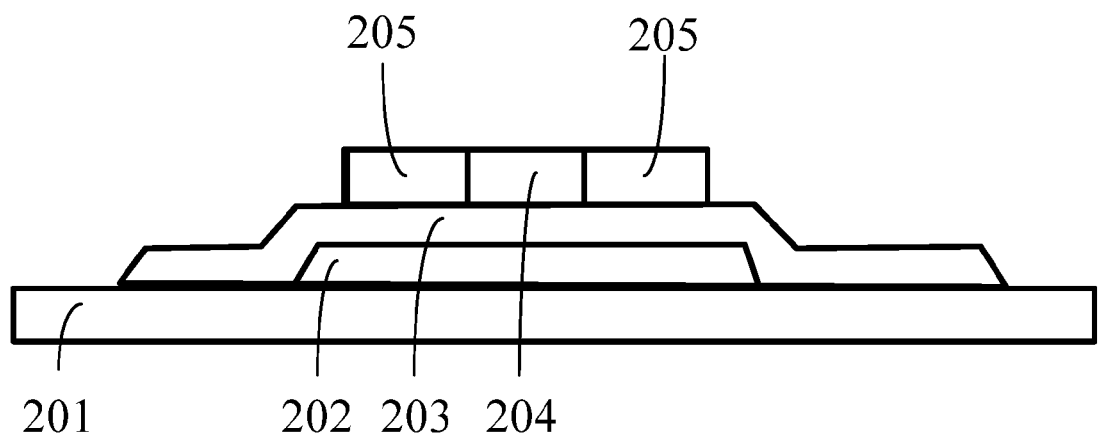
FIG. 4 is a schematic view illustrating forming a source electrode and an active layer in the manufacturing method according to the embodiment of the present invention.

As shown in FIG. 4, in S103, the active layer 204 and the source electrode 205 are formed on the gate insulation layer 203. The source electrode 205 is set against and circumferentially surrounds an outer circumference of the active layer 204. The orthogonal projection of the source electrode 205 on the backing 201 is circular, and the orthogonal projection of the active layer 204 on the backing 201 is circular; and the orthogonal projections of the source electrode 205 and the active layer 204 on the backing 201 are both concentric with respect to the first centro-sym metric pattern. In another embodiment, the orthogonal projections of the source electrode 205 and the active layer 204 on the backing 201 can be other centro-symmetric patterns, such as a square.

Further, in S103, forming an active layer and a source electrode on the gate insulation layer comprises:

forming a semiconductor layer on the gate insulation layer, wherein an orthogonal projection of the semiconductor layer on the backing is a second centro-symmetric pattern and the second centro-symmetric pattern and the first centro-symmetric pattern are concentric;

coating a first photoresist layer on an area of the gate insulation layer excluding the semiconductor layer and coating a second photoresist layer on the semiconductor layer, wherein an orthogonal projection of the second photoresist layer on the backing is a centro-symmetric pattern that is concentric with respect to the first centro-symmetric pattern and a portion of the semiconductor layer that is coated with the second photoresist layer forming the active layer;

subjecting an area of the semiconductor layer excluding the portion coated with the second photoresist layer to ion injection so as to convert a portion of the semiconductor layer that excludes the active layer into a source electrode; and removing the first photoresist layer and the second photoresist layer.

Figure 5:
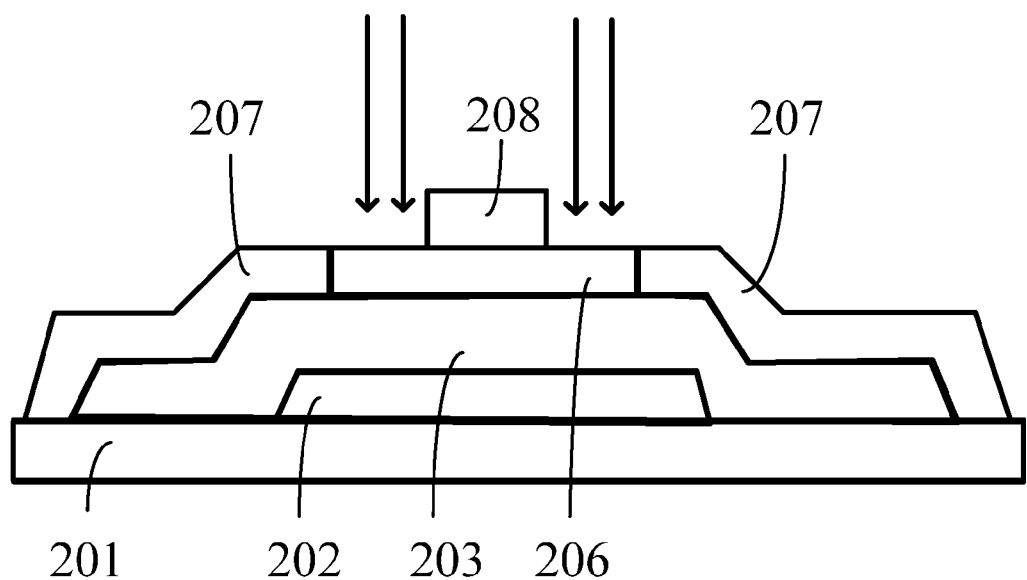
FIG. 5 is a schematic view illustrating injecting ions in the manufacturing method according to the embodiment of the present invention.

Specifically, as shown in FIG. 5, a semiconductor layer 206 is deposited on the gate insulation layer 203 such that the semiconductor layer 206 covers a part of the gate insulation layer 203. An orthogonal projection of the semiconductor layer 206 on the backing 201 is a circle that is concentric with respect to the first centro-symmetric pattern. The semiconductor layer 206 is formed of a material comprising, but not limited to, amorphous silicon or indium gallium zinc oxide. When amorphous silicon is involved, chemical vapor deposition is used to deposit an amorphous silicon material on the gate insulation layer 203 to form the semiconductor layer 206; when indium gallium zinc oxide is involved, physical vapor deposition is used to deposit indium gallium zinc oxide on the gate insulation layer 203 to form the semiconductor layer 206. Afterwards, a first photoresist layer 207 is coated on an area of the gate insulation layer 203 that excludes the semiconductor layer 206 and a second photoresist layer 208 is coated on the semiconductor layer 206. The orthogonal projection of the second photoresist layer 208 on the backing 201 is circular, and the orthogonal projection of the second photoresist layer 208 on the backing 201 is concentric with respect to the first centro-symmetric pattern. The first photoresist layer 207 and the second photoresist layer 208 function to shield and protect an area where ion injection is not conducted. Next, as indicated by arrows shown in FIG. 5, ion injection is applied to an area of the semiconductor layer 206 where no photoresist is coated to achieve surface modification of the material contained in this area for changing into the source electrode 205. A portion of the semiconductor layer 206 that excludes the source electrode 205, namely the portion that is coated with the second photoresist layer 208, forms and serves as the active layer 204. After the ion injection, the first photoresist layer 207 and the second photoresist layer 208 are removed. In another embodiment, the orthogonal projections of the semiconductor layer 206 and the second photoresist layer 208 on the backing 201 can be other centro-symmetric patterns, such as a square. In another embodiment, different regular operations, other than ion injection, can be directly used to form the active layer 204 and the source electrode 205.

Figure 6:
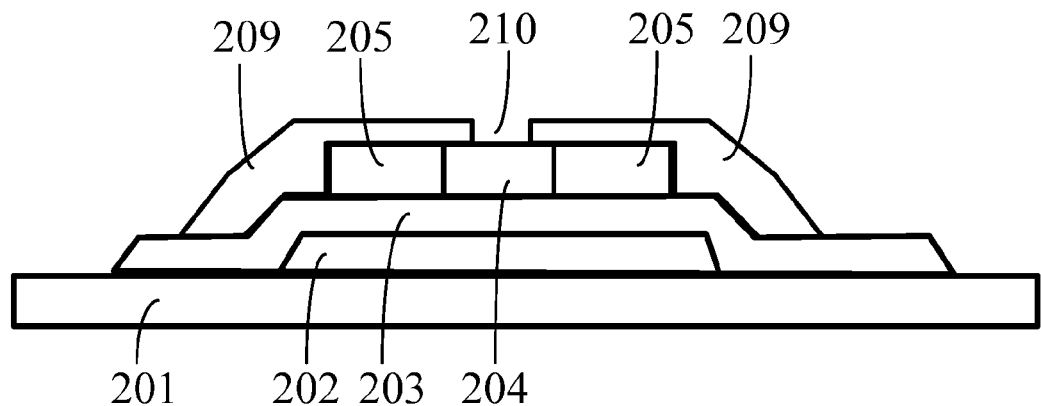
FIG. 6 is a schematic view illustrating forming a passivation layer in the manufacturing method according to the embodiment of the present invention.

As shown in FIG. 6, in S104, chemical vapor deposition is used to form a passivation layer 209 on the active layer 204 and the source electrode 205. The orthogonal projection of the passivation layer 209 on the backing 201 is a circle that is concentric with respect to the first centro-symmetric pattern. The passivation layer 209 is formed of a material comprising, but not limited to, silicon nitride or silicon oxide. A portion of the passivation layer 209 that corresponds to the active layer 204 is provided with a via 210 formed therein. An axis of the via 210 extends through a center of symmetry of the first centro-sym metric pattern, namely the via 210 and the active layer 204 are concentric. In another embodiment, other regular operations can be applied to form the passivation layer 209, and/or the orthogonal projection of the passivation layer 209 on the backing 201 can be other centro-symmetric patterns, such as a square.

Figure 7:
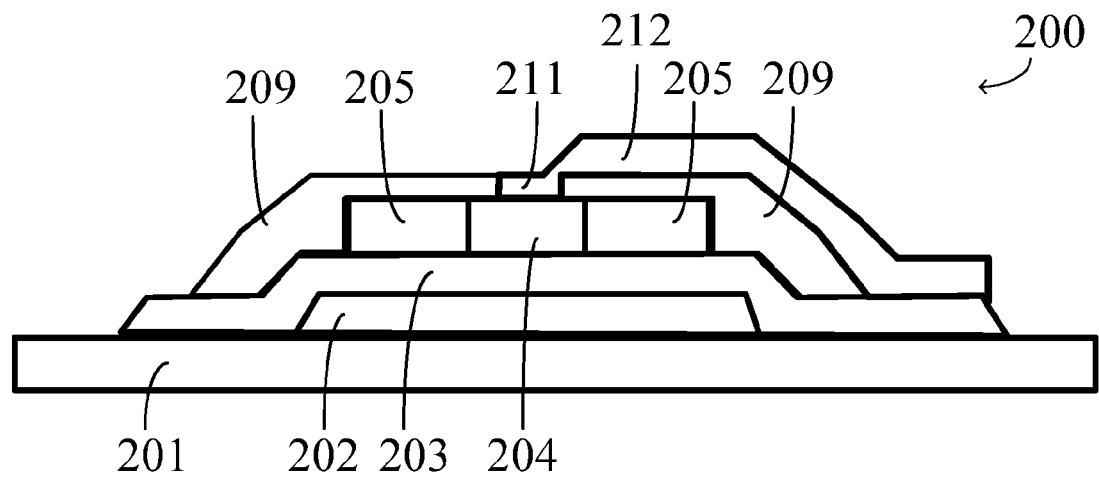
FIG. 7 is a schematic view illustrating forming a drain electrode and a pixel electrode in the manufacturing method according to the embodiment of the present invention.

As shown in FIG. 7, in S105, physical vapor deposition and a patterning operation are used to simultaneously form a drain electrode 211 and a pixel electrode 212. The drain electrode 211 is located within the via 210 and is electrically connected to the active layer 204. The orthogonal projection of the drain electrode 211 on the backing 201 is a circle that is concentric with respect to the first centro-symmetric pattern. The pixel electrode 212 is located on the passivation layer 209 and the insulation protection layer 203 and the pixel electrode 212 has an end connected to the drain electrode 211 and an opposite end located in a pixel unit of the thin-film transistor (not shown). The technical solution of the instant embodiment allows for simultaneous formation of the drain electrode 211 and the pixel electrode 212 and, compared to a technical solution that form the drain electrode 211 and the pixel electrode 212 sequentially, simplifies the operation, improves manufacturing efficiency, and lowers down manufacturing cost. It is apparent that in other embodiments, other regular operations can be applied to form the drain electrode 211 and the pixel electrode 212, sequentially.

Thus, the present invention provides a thin-film transistor substrate manufacturing method 100, which comprises forming a thin-film transistor that is of centro-symmetry on a backing such that the thin-film transistor receives similar stress and strain in all the bending directions and thus the electrical property of the thin-film transistor is all the bending direction are consistent. Further, compared to other non-symmetric structures, due to being hard to induce stress asymmetry in the thin-film transistor so that the thin-film transistor is not easily damaged by stress, the centro-symmetric structure improves the reliability of the thin-film transistor.

The above provides a detailed description for the thin-film transistor substrate manufacturing method according to an embodiment of the present invention, with reference to FIG. 1. A thin-film transistor substrate according to an embodiment of the present invention will be described with reference to FIG. 7.

As shown in FIG. 7, a thin-film transistor substrate 200 according to the instant embodiment comprises a backing 201, a gate electrode 202, a gate insulation layer 203, an active layer 204, a source electrode 205, a passivation layer 209, a drain electrode 211, and a pixel electrode 212. The thin-film transistor substrate 200 is manufactured with the manufacturing method described in the above embodiment.

The backing 201 can be curved glass plate or a flexible glass plate. The backing 201 is provided thereon with a thin-film transistor array, scan lines, data lines, and a driver chip (not shown). The curved or flexible backing shows excellent adaptability and high flexibility, making it more suitable for making a flexible screen. In another embodiment, the backing 201 can be a layer of other materials, such as a PI film.

The gate electrode 202 is arranged on the backing 201. An orthogonal projection of the gate electrode 202 on the backing 201 is a first centro-symmetric pattern, and preferably, in the instant embodiment, the first centro-symmetric pattern is circular. In another embodiment, the first centro-symmetric pattern can be other centro-symmetric patterns, such as a square.

The gate insulation layer 203 is arranged on the backing 201 and completely covers the gate electrode 202. The gate insulation layer 203 is of a centro-symmetric structure. An orthogonal projection of the gate insulation layer 203 on the backing 201 is circular and is concentric with respect to the orthogonal projection of the gate electrode 202 on the backing 201.

The active layer 204 and the source electrode 205 are both arranged on the gate insulation layer 203. The source electrode 205 is set against and circumferentially surrounds an outer circumference of the active layer 204. An orthogonal projection of the source electrode 205 on the backing 201 is circular and an orthogonal projection of the active layer 204 on the backing 201 is circular. The orthogonal projections of the source electrode 205 and the active layer 204 on the backing 201 are both concentric with respect to the first centro-symmetric pattern. In another embodiment, the orthogonal projections of the source electrode 205 and the active layer 204 on the backing 201 can be other centro-symmetric patterns, such as a square.

The passivation layer 206 is arranged on the active layer 204 and the source electrode 205. An orthogonal projection of the passivation layer 209 on the backing 201 is a circle that is concentric with respect to the first centro-symmetric pattern. The passivation layer 209 has an area corresponding to the active layer 204 and comprising a via 210 formed therein. The via 210 has an axis extending through a center of symmetry of the first centro-symmetric pattern, namely the via 210 and the active layer 204 are concentric. In another embodiment, the orthogonal projection of the passivation layer 209 on the backing 201 can be other centro-symmetric patterns, such as a square.

The drain electrode 211 is located within the via 210 and is electrically connected to the active layer 204. An orthogonal projection of the drain electrode 211 on the backing 201 is a circle that is concentric with respect to the first centro-symmetric pattern. The pixel electrode 212 is located on the passivation layer 209 and the insulation protection layer 203. The pixel electrode 212 has an end connected to the drain electrode 211 and an opposite end located in a pixel unit of the thin-film transistor (not shown).

An embodiment of the present invention also provides a liquid crystal panel (not shown). The liquid crystal panel comprises the thin-film transistor substrate 200 described in the above embodiment.

The present invention has been described with reference to the preferred embodiments. However, it is noted that those skilled in the art would appreciates that various improvements and modifications are still available without departing from the scope of the present invention and such improvements and modifications are considered within the scope of protection of the present invention.

What is claimed is:

1. A manufacturing method of a thin-film transistor substrate, wherein the thin-film transistor substrate comprises a backing, the manufacturing method comprising:

forming a gate electrode on a backing, wherein an orthogonal projection of the gate electrode on the backing is a first centro-symmetric pattern;

forming a gate insulation layer on the gate electrode, wherein an orthogonal projection of the gate insulation layer on the backing is a centro-symmetric pattern that is concentric with respect to the first centro-symmetric pattern;

forming an active layer and a source electrode on the gate insulation layer, wherein the source electrode surrounds an outer circumference of the active layer and an orthogonal projection of the source electrode on the backing and an orthogonal projection of the active layer on the backing are both centro-symmetric patterns that are concentric with respect to the first centro-symmetric pattern;

forming a passivation layer on the source electrode and the active layer, wherein an orthogonal projection of the passivation layer on the backing is a centro-symmetric pattern that is concentric with respect to the first centro-symmetric pattern and the passivation layer comprises an area that corresponds to the active layer and comprises a via formed therein such that an axis of the via extends through a center of symmetry of the first centro-symmetric pattern; and forming a drain electrode within the via such that the drain electrode and the active layer are electrically connected; and forming a pixel electrode on the passivation layer and the insulation protection layer such that the pixel electrode has an end connected to the drain electrode;

wherein the gate electrode, the gate insulation layer, and the active layer are stacked, in that order, on the backing and are concentric to each other to form a centro-symmetric stack and the source electrode and the drain electrode are concentrically arranged on the stack.

2. The manufacturing method as claimed in claim 1, wherein "forming an active layer and a source electrode on the gate insulation layer" comprises:

forming a semiconductor layer on the gate insulation layer, wherein an orthogonal projection of the semiconductor layer on the backing is a second centro-symmetric pattern and the second centro-symmetric pattern and the first centro-symmetric pattern are concentric;

coating a first photoresist layer on an area of the gate insulation layer excluding the semiconductor layer and coating a second photoresist layer on the semiconductor layer, wherein an orthogonal projection of the second photoresist layer on the backing is a centro-symmetric pattern that is concentric with respect to the first centro-symmetric pattern and a portion of the semiconductor layer that is coated with the second photoresist layer forming the active layer;

subjecting an area of the semiconductor layer excluding the portion coated with the second photoresist layer to ion injection so as to convert a portion of the semiconductor layer that excludes the active layer into a source electrode; and removing the first photoresist layer and the second photoresist layer.

3. The manufacturing method as claimed in claim 1, wherein the orthogonal projections of the gate electrode, the gate insulation layer, the source electrode, the active layer, and the drain electrode on the backing are circular or square.

4. The manufacturing method as claimed in claim 2, wherein the orthogonal projections of the gate electrode, the gate insulation layer, the source electrode, the active layer, and the drain electrode on the backing are circular or square.

5. The manufacturing method as claimed in claim 2, wherein "forming a semiconductor layer on the gate insulation layer" comprises:
   using chemical vapor deposition to deposit an amorphous silicon material on the gate insulation layer to form the semiconductor layer; or alternatively, using physical vapor deposition to deposit indium gallium zinc oxide on the gate insulation layer to form the semiconductor layer.

6. The manufacturing method as claimed in claim 1, wherein physical vapor deposition and a patterning operation are conducted to simultaneously form the drain electrode and the pixel electrode.

7. The manufacturing method as claimed in claim 2, wherein physical vapor deposition and a patterning operation are conducted to simultaneously form the drain electrode and the pixel electrode.

8. The manufacturing method as claimed in claim 4, wherein physical vapor deposition and a patterning operation are conducted to simultaneously form the drain electrode and the pixel electrode.

9. A thin-film transistor substrate, comprising a backing, wherein the thin-film transistor substrate further comprises:
   a gate electrode, a gate insulation layer, an active layer, a source electrode, a passivation layer, a drain electrode, and a pixel electrode; the gate electrode being arranged on the backing, an orthogonal projection of the gate electrode on the backing being a first centro-symmetric pattern; the gate insulation layer being on the gate electrode, an orthogonal projection of the gate insulation layer on the backing being a centro-symmetric pattern concentric with respect to the first centro-symmetric pattern; the active layer and the source electrode being both arranged on the gate insulation layer, the source electrode surrounding an outer circumference of the active layer, an orthogonal projection of the source electrode on the backing and an orthogonal projection of the active layer on the backing being both centro-symmetric patterns concentric with respect to the first centro-symmetric pattern; the passivation layer being located on the source electrode and the active layer, an orthogonal projection of the passivation layer on the backing being a centro-symmetric pattern concentric with respect to the first centro-symmetric pattern, the passivation layer having an area corresponding to the active layer and comprising a via formed therein, the via having an axis extending through a center of symmetry of the first centro-symmetric pattern; the drain electrode being located in the via and electrically connected to the active layer; the pixel electrode being located on the passivation layer and the insulation protection layer, the pixel electrode having an end connected to the drain electrode;
   wherein the gate electrode, the gate insulation layer, and the active layer are stacked, in that order, on the backing and are concentric to each other to form a centro-symmetric stack and the source electrode and the drain electrode are concentrically arranged on the stack.

10. A liquid crystal panel, comprising the thin-film transistor substrate as claimed in claim 9.

\* \* \* \* \*